(12) United States Patent
Yang et al.

(10) Patent No.: US 11,942,857 B2
(45) Date of Patent: Mar. 26, 2024

(54) POWER SUPPLY

(71) Applicant: Industrial Technology Research Institute, Hsinchu (TW)

(72) Inventors: Cheng-Wei Yang, Hsinchu County (TW); Chueh-Hao Yu, Hsinchu County (TW); Chien-Yu Chen, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 177 days.

(21) Appl. No.: 17/564,217

(22) Filed: Dec. 29, 2021

(65) Prior Publication Data

US 2023/0179076 A1 Jun. 8, 2023

(30) Foreign Application Priority Data

Dec. 2, 2021 (TW) .................................. 110144945

(51) Int. Cl.
*H02M 1/32* (2007.01)
*H02M 1/00* (2006.01)
*H03K 19/20* (2006.01)

(52) U.S. Cl.
CPC ............. *H02M 1/32* (2013.01); *H02M 1/008* (2021.05); *H03K 19/20* (2013.01)

(58) Field of Classification Search
CPC ........ H02M 1/007; H02M 1/008; H02M 1/32; H02M 1/325; H02H 5/005
See application file for complete search history.

(56) References Cited

U.S. PATENT DOCUMENTS

| 6,643,151 | B1 | 11/2003 | Nebrigic et al. |
| 9,705,320 | B1 * | 7/2017 | Petrick .................... G06F 1/189 |
| 10,177,757 | B2 * | 1/2019 | Dickey .................. H03K 17/24 |
| 10,289,178 | B1 | 5/2019 | Lynam et al. |

(Continued)

FOREIGN PATENT DOCUMENTS

| CN | 100512004 | 7/2009 |
| CN | 102799257 | 11/2012 |

(Continued)

OTHER PUBLICATIONS

"Office Action of Taiwan Counterpart Application", dated Nov. 3, 2022, p. 1-p. 6.

(Continued)

*Primary Examiner* — Fred E Finch, III
(74) *Attorney, Agent, or Firm* — JCIPRNET

(57) ABSTRACT

A power supply is provided. The power supply includes a power supply circuit and a control circuit. The power supply circuit includes a voltage converter and multiple point-of-load circuits. The voltage converter generates a third voltage according to a first voltage. The load point-of-load circuits generate at least one second voltage and at least one state signal according to the third voltage. The at least one second voltage is suitable for supplying power to a load. The control circuit is coupled to the power supply circuit. The control circuit determines whether a single event latch-up occurs in the power supply circuit according to the at least one state signal. When the single event latch-up occurs in the power supply circuit, the control circuit switches off the power supply circuit to stop generating the at least one second voltage and the at least one state signal.

8 Claims, 4 Drawing Sheets

(56) References Cited

U.S. PATENT DOCUMENTS

| | | | |
|---|---|---|---|
| 10,374,505 B2 | | 8/2019 | Wood |
| 10,411,095 B2 * | | 9/2019 | Yoshioka |
| 10,886,723 B2 * | | 1/2021 | Vail ..................... H02H 9/025 |
| 2011/0307910 A1 * | | 12/2011 | Nagasato ............... H02M 1/32 |
| 2014/0108831 A1 | | 4/2014 | Dube et al. |
| 2022/0045611 A1 * | | 2/2022 | Zou ..................... H02M 1/088 |

FOREIGN PATENT DOCUMENTS

| | | |
|---|---|---|
| CN | 103762558 | 4/2014 |
| CN | 107134758 | 2/2019 |
| CN | 111293668 | 6/2020 |
| TW | M366112 | 10/2009 |
| TW | I492471 | 7/2015 |
| TW | 201735491 | 10/2017 |

OTHER PUBLICATIONS

Vladimir Petrovic et al., "Integrated Single Event Latchup Protection for ASICs used in Space Applications", IEEE 21st Telecommunications forum TELFOR 2013, Nov. 26-28, 2013, pp. 624-627.
R. Secondo et al., "Analysis of SEL on Commercial SRAM Memories for Latchup Detection and Protection in LEO Space Applications", 2016 16th European Conference on Radiation and Its Effects on Components and Systems (RADECS), Sep. 19-23, 2016, pp. 1-5.
Guo Yue et al., "A Single Event Latch-up protection method for SRAM FPGA", 2017 IEEE 13th International Conference on Electronic Measurement & Instruments, Oct. 20-22, 2017, pp. 332-336.
Marko Andjelkovic et al., "Simulation-based Analysis of the Single Event Transient Response of a Single Event atchup Protection Switch", 2015 IEEE 18th International Symposium on Design and Diagnostics of Electronic Circuits & Systems, Apr. 22-24, 2015, pp. 255-258.

* cited by examiner

POWER SUPPLY

CROSS-REFERENCE TO RELATED APPLICATION

This application claims the priority benefit of Taiwan application serial no. 110144945, filed on Dec. 2, 2021. The entirety of the above-mentioned patent application is hereby incorporated by reference herein and made a part of this specification.

TECHNICAL FIELD

The disclosure relates to a power supply, and more particularly, to a power supply that may detect a single event latch-up (SEL).

BACKGROUND

The power supply is the most important source of power for all electrical equipment. The main function is to convert a high-voltage alternating current or a direct current into low-voltage stable direct current to supply power to the load. In recent years, due to the increasing demand for low earth orbit satellites, the power supply has also been applied to the aerospace circuit. Under normal operation, the operating current of the load device powered by the power supply is a stable value. However, in the space environment, the radiation interference of cosmic rays and a large number of high-energy protons and heavy ions may cause the single event latch-up effect, and trigger the parasitic bipolar transistor in the complementary metal-oxide-semiconductor (CMOS) circuit to form a high-current state of the positive feedback and cause the latch-up phenomenon, thereby resulting in a jump in the level state and an extremely high current burst, which is much higher than the range that circuit elements may withstand. In severe cases, it is possible to cause circuit damage, for example, various phenomena that are so serious to be recovered such as burned chips, destroyed P/N gates, and a lot of noise generated in a charge coupled device (CCD). Therefore, in aerospace applications, a single event latch-up protection circuit must be added. Moreover, in order to eliminate the single event latch-up, the power supply must be restored to its original state. Therefore, when the single event latch-up occurs, the power supply circuit must be immediately switched off to protect the load device, and the power supply needs to be restarted again after the single event latch-up effect disappears.

More particularly, when the single event latch-up occurs, if the power supply is stopped only for the power supply circuit where the latch-up occurs, it is also possible to cause other power supply circuits to have issues of the single event latch-up or cause an error in the interlocking function of the system. Moreover, the current existing single event latch-up protection circuit usually includes a current acquisition module, a voltage comparison module, a switch module, a switch control module, and a switch timing turn-on module, etc., resulting in high design complexity and low reliability. In addition, the cost of using components with space specifications is often ten times or even dozens of times the cost of using components with commercial specifications, resulting in huge construction costs. Therefore, how to detect and deal with the single event latch-up effect as well as reduce circuit cost and complexity is one of the many goals that those skilled in the art should work on.

SUMMARY

In view of this, the disclosure provides a power supply, which may detect and deal with a single event latch-up effect.

In an embodiment of the disclosure, the power supply includes a power supply circuit and a control circuit. The power supply circuit generates at least one second voltage and at least one state signal according to a first voltage. The at least one second voltage is suitable for supplying power to a load. The control circuit is coupled to the power supply circuit. The control circuit determines whether a single event latch-up occurs in the power supply circuit according to the at least one state signal. When the single event latch-up occurs in the power supply circuit, the control circuit switches off the power supply circuit to stop generating the at least one second voltage and the at least one state signal. The power supply circuit includes a voltage converter and multiple point-of-load circuits. The voltage converter generates a third voltage according to the first voltage. The point-of-load circuits are coupled to the voltage converter. The point-of-load circuits generate the at least one second voltage and the at least one state signal according to the third voltage.

Based on the above, the power supplies in the embodiments of the disclosure may supply the power to the load through the power supply circuit, determines whether the single event latch-up occurs in the power supply circuit through the control circuit, and switches off the power supply circuit through the control circuit to cut off all the power supplies to the load from the point-of-load circuits in the power supply circuit when the single event latch-up occurs. In this way, the single event latch-up effect may be detected and dealt with, avoiding the burning of circuit elements caused by excessive current, so as to protect load devices that are sensitive to the single event latch-up, and have effects of low circuit complexity, low design cost, and high circuit reliability.

Several exemplary embodiments accompanied with figures are described in detail below to further describe the disclosure in details.

DETAILED DESCRIPTION OF DISCLOSED EMBODIMENTS

Figure 1:
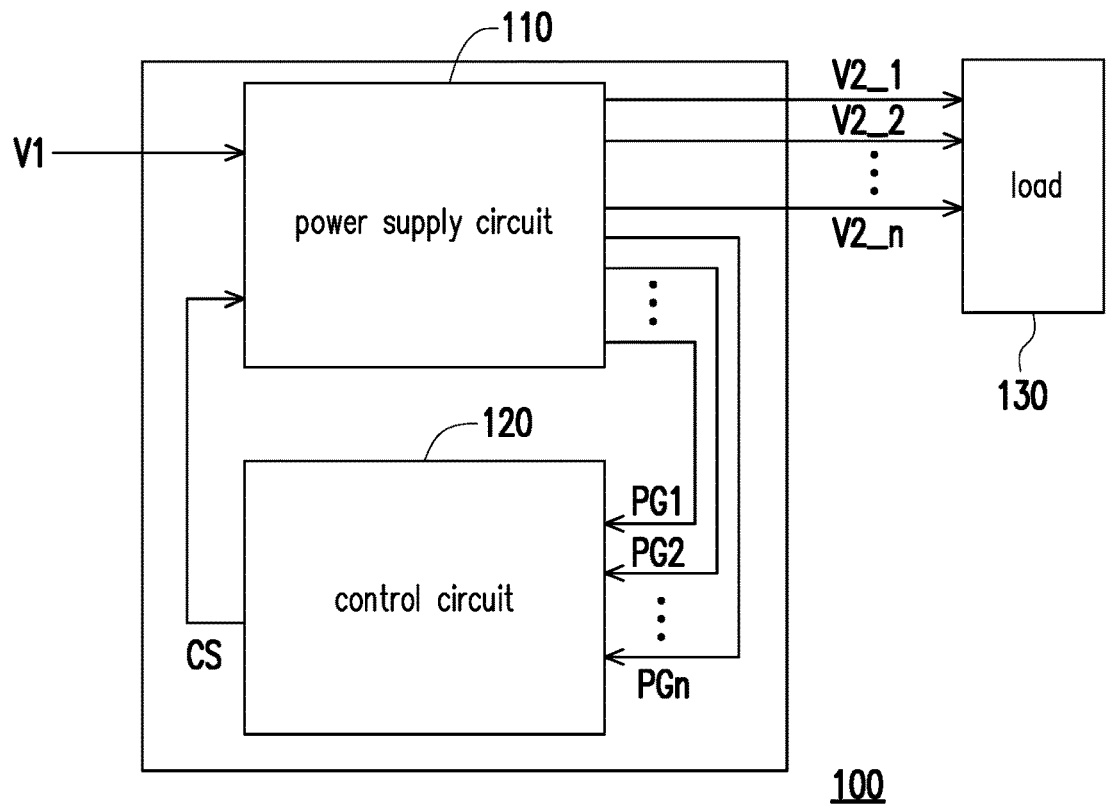
FIG. 1 is a schematic view of a circuit block of a power supply according to an embodiment of the disclosure.

The term "coupling (or connection)" as used throughout the present specification (including the claims) may refer to any direct or indirect connection means. For example, if it is described that a first device is coupled (or connected) to a second device, it should be interpreted that the first device can be directly connected to the second device, or the first device can be indirectly connected to the second device through other devices or a certain connection means. The terms "first", "second" and the like as mentioned throughout the present specification (including the claims) are used to name the elements or to distinguish between different embodiments or scopes, rather than setting an upper or lower limit on the number of the elements or the order of the elements. In addition, wherever possible, elements/components/steps with the same reference numerals in the drawings and embodiments represent the same or similar parts. Cross-reference may be made between the elements/components/steps in different embodiments that are denoted by the same reference numerals or that have the same names.

FIG. 1 is a schematic view of a circuit block of a power supply 100 according to an embodiment of the disclosure. In the embodiment shown in FIG. 1, the power supply 100 includes a power supply circuit 110 and a control circuit 120. The power supply 100 is suitable for receiving a first voltage V1 and supplying one or more second voltages (for example, second voltages V2_1, V2_2, ..., V2_n in the figure) to a load 130. In some embodiments, one or more of the second voltages V2_1 to V2_n generated by the power supply 100 may also be respectively supplied to different loads, and this embodiment is not limited thereto. The load 130 may be any electronic device or equipment, and the first voltage V1 may be an alternating current or a direct current. In some embodiments, the second voltages V2_1 to V2_n may be less than or equal to the first voltage V1, and this embodiment is not limited thereto.

In this embodiment, the power supply circuit 110 is configured to receive the first voltage V1, and generate the second voltages V2_1 to V2_n and one or more state signals (for example, state signals PG1, PG2, ..., PGn in the figure) corresponding to the second voltages V2_1 to V2_n according to the first voltage V1. The actual number n of the second voltages V2_1 to V2_n and the state signals PG1 to PGn may be determined according to actual designs or requirements, such as a wattage or the number of groups of the load 130, and this embodiment is not limited thereto. In some embodiments, the power supply circuit 110 may include one or more voltage converters and/or one or more point-of-load (POL) circuits, and this embodiment is not limited thereto. In some embodiments, the state signals PG1 to PGn may include a power good signal to indicate whether a voltage or a current state of the second voltages V2_1 to V2_n generated by point-of-load circuits 112_1 to 112_n is abnormal.

In this embodiment, the control circuit 120 is coupled to the power supply circuit 110 to receive the state signals PG1 to PGn. The control circuit 120 may determine whether a single event latch-up occurs in the power supply circuit 110 according to the state signals PG1 to PGn. When it is determined that the single event latch-up occurs in the power supply circuit 110, the control circuit 120 may switch off the power supply circuit 110 to stop generating the second voltages V2_1 to V2_n and the state signals PG1 to PGn. For example, the control circuit 120 may generate a control signal CS according to the state signals PG1 to PGn to switch on or switch off the power supply circuit 110. Actual implementations of the power supply circuit 110 and the control circuit 120 will be described in more detail in subsequent embodiments.

According to design requirements, in some embodiments, related functions of the control circuit 120 may be implemented as hardware using hardware description languages (such as Verilog HDL or VHDL) or other suitable programming languages. For example, the related functions of the control circuit 120 may be implemented in one or more microcontrollers, microprocessors, application-specific integrated circuits (ASICs), digital signal processors (DSPs), field programmable gate arrays (FPGAs) and/or various logic blocks, modules, and circuits in other processing units. In terms of software and/or firmware, the related functions of the control circuit 120 may be implemented as programming codes, for example, using general programming languages (such as C, C++, or assembly languages) or other suitable programming languages. The programming codes may be recorded/stored in a "non-transitory computer readable medium", for example, including a read only memory (ROM), a tape, a disc, a card, a semiconductor memory, a programmable logic circuit, and/or a storage device. A central processing unit (CPU), the microcontroller, or the microprocessor may read and execute the programming codes from the non-transitory computer readable medium, thereby achieving the related functions of the control circuit 120.

Figure 2:
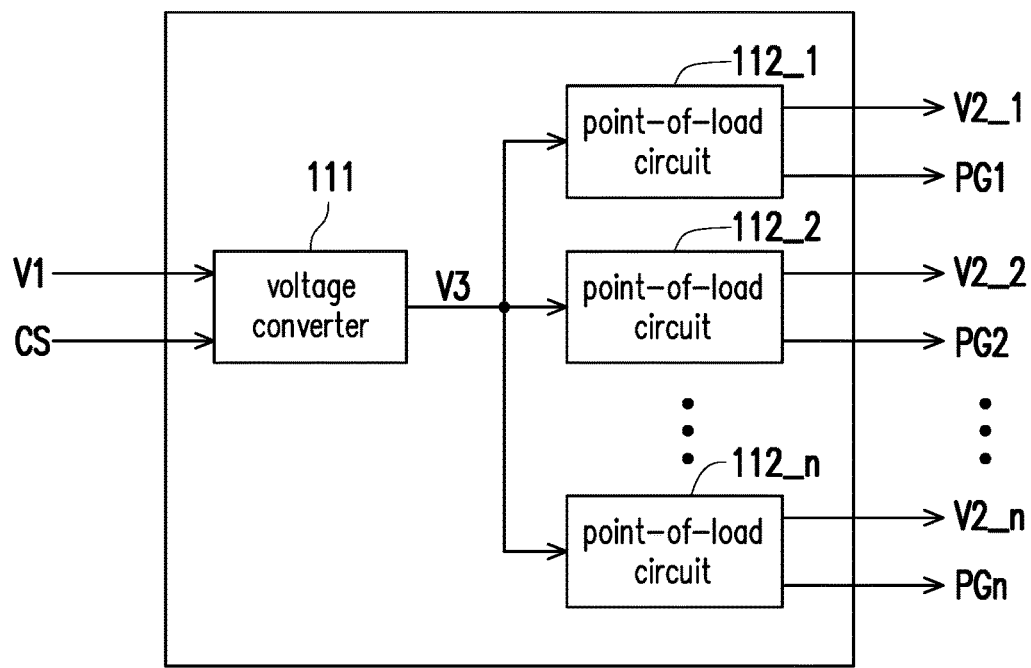
FIG. 2 is a schematic view of a circuit block of a power supply circuit according to an embodiment of the disclosure.

FIG. 2 is a schematic view of a circuit block of the power supply circuit 110 according to an embodiment of the disclosure. According to the actual designs, the power supply circuit 110 shown in FIG. 1 may be derived by analogy with reference to a related description of the power supply circuit 110 shown in FIG. 2. In the embodiment shown in FIG. 2, according to the actual requirements, the power supply circuit 110 may include a voltage converter 111 and the one or more point-of-load circuits (for example, the point-of-load circuits 112_1, 112_2, ..., 112_n in the figure). The voltage converter 111 may be a DC-DC voltage converter, an AC-DC voltage converter, or any kind of voltage converter. The point-of-load circuits 112_1 to 112_n may be voltage converters or voltage regulators, and actual structures and the number n thereof may be set according to the actual designs. This embodiment is not limited thereto. In addition, the use of dual-stage conversion to supply power may have effects such as high efficiency, versatility, and low cost.

In this embodiment, the voltage converter 111 may receive the first voltage V1 and generate a third voltage V3 according to the first voltage V1. In some embodiments, the voltage converter 111 may receive the control signal CS provided by a user or any device (for example, the control circuit 120 shown in FIG. 1) to stop or start generating the third voltage V3. In this embodiment, the point-of-load circuits 112_1 to 112_n are all coupled to the voltage converter 111 to receive the third voltage V3. The point-of-load circuits 112_1 to 112_n may respectively generate the second voltages V2_1 to V2_n and the state signals PG1 to PGn according to the third voltage V3. In some embodiments, the third voltage V3 may be less than or equal to the first voltage V1. In some embodiments, the second voltages V2_1 to V2_n may be less than or equal to the third voltage V3. The second voltages V2_1 to V2_n may have the same or different voltage values among one another. For example, in some embodiments, the first voltage V1 may be 28 volts; the third voltage V3 may be 5 volts, and the second voltages V2_1 to V2_n may be 0.9 volts, 1.3 volts, 1.8 volts, or any other voltage value. This embodiment is not limited thereto. The state signals PG1 to PGn may indicate whether the voltage or the current state of the corresponding second voltages V2_1 to V2_n is abnormal. For example, in some embodiments, when the state signal PG1 is at a first logic level (for example, a logic high level), it indicates that the second voltage V2_1 supplies the power normally, and when the state signal PG1 is at a second logic level (for example, a logic low level), it indicates that the second voltage V2_1 supplies the power abnormally. The other state signals PG2 to PGn may be derived by analogy.

Figure 3:
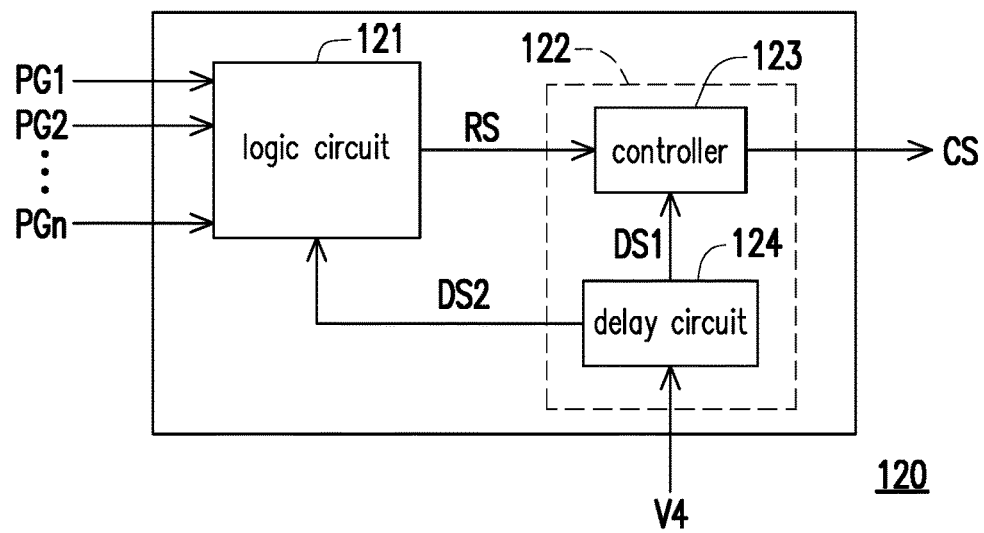
FIG. 3 is a schematic view of a circuit block of a control circuit according to an embodiment of the disclosure.

FIG. 3 is a schematic view of a circuit block of the control circuit 120 according to an embodiment of the disclosure. According to the actual designs, the control circuit 120 shown in FIG. 1 may be derived by analogy with reference to a related description of the control circuit 120 shown in FIG. 3. In the embodiment shown in FIG. 3, according to the actual requirements, the control circuit 120 may include a logic circuit 121 and a processing circuit 122. The logic circuit 121 may include one or more logic gates configured to receive the state signals PG1 to PGn and generate a reset signal RS according to the state signals PG1 to PGn.

In this embodiment, the processing circuit 122 may be coupled to the logic circuit 121 to receive the reset signal RS, and configured to generate the control signal CS according to the reset signal RS. In some embodiments, according to actual applications, the processing circuit 122 may further receive a fourth voltage V4 and generate the control signal CS according to the reset signal RS and/or the fourth voltage V4. For example, in some embodiments, the processing circuit 122 may include a controller 123 and a delay circuit 124. The delay circuit 124 may be coupled to the logic circuit 121 and/or the controller 123, and configured to receive the fourth voltage V4 and generate one or more driving signals according to the fourth voltage V4 to drive the logic circuit 121 and/or the controller 123. For example, in this embodiment, the delay circuit 124 may generate a first driving signal DS1 and a second driving signal DS2 according to the fourth voltage V4. The logic circuit 121 may receive the second driving signal DS2 to generate the reset signal RS according to the state signals PG1 to PGn and the second driving signal DS2 at the same time. The controller 123 may receive the first driving signal DS1 to generate the control signal CS according to the reset signal RS and the first driving signal DS1 at the same time.

Figure 4:
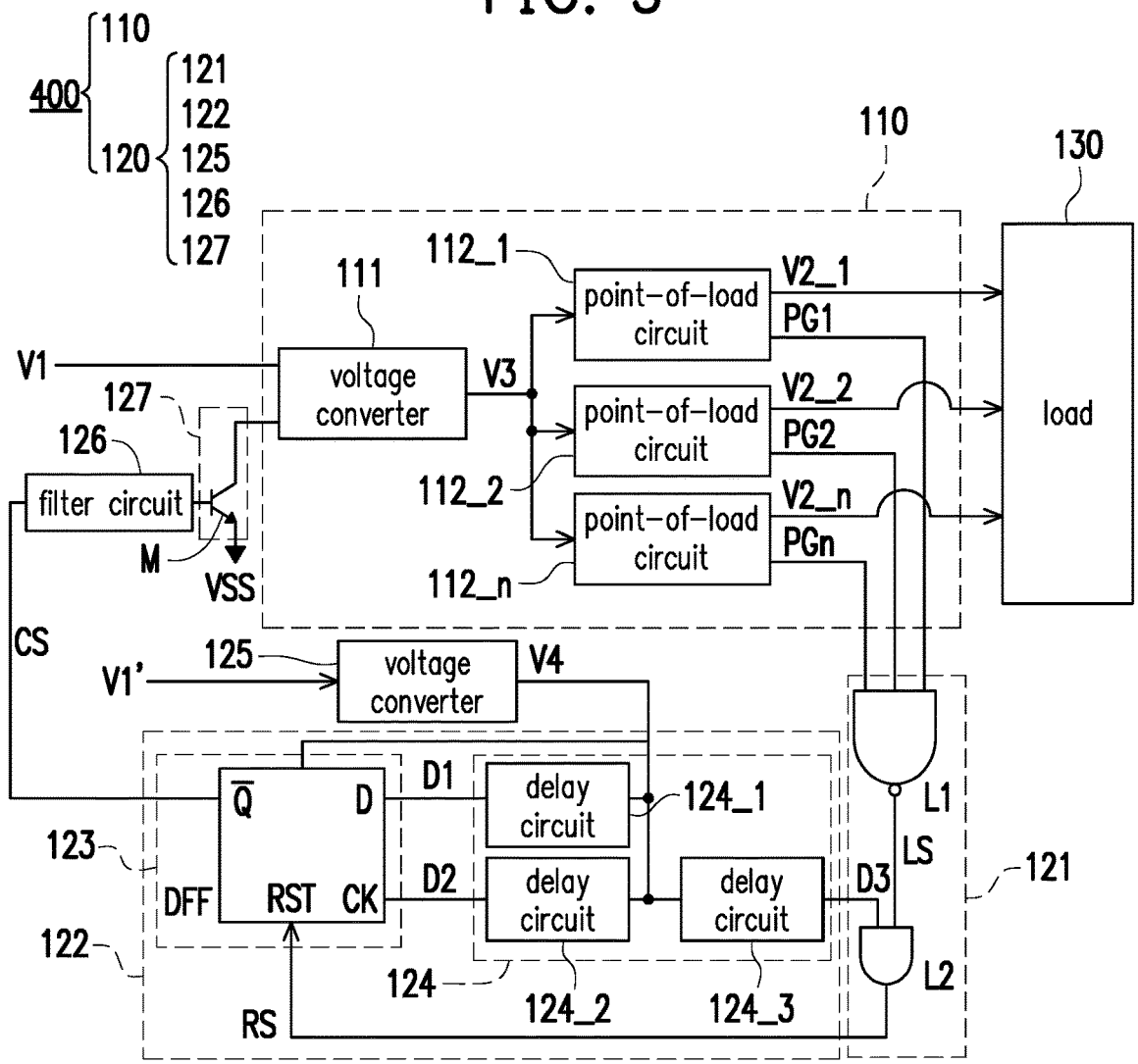
FIG. 4 is a schematic view of a circuit block of a power supply according to another embodiment of the disclosure.

For example, FIG. 4 is a schematic view of a circuit block of a power supply 400 according to another embodiment of the disclosure. In the embodiment shown in FIG. 4, the power supply 400 includes the power supply circuit 110 and the control circuit 120. The power supply circuit 110 is configured to receive the first voltage V1 and generate the one or more second voltages V2_1 to V2_n to supply the power to the load 130. The control circuit 120 is configured to receive the one or more state signals PG1 to PGn generated by the power supply circuit 110 to determine whether the single event latch-up occurs in the power supply circuit 110, and generate the control signal CS to switch on or switch off the power supply circuit 110. The power supply circuit 110 shown in FIG. 4 may be derived by analogy with reference to a related description of the power supply circuit 110 shown in FIG. 1 or the related description of the power supply circuit 110 shown in FIG. 2. The control circuit 120 shown in FIG. 4 may be used as an implementation example of the control circuit 120 shown in FIG. 1 or the control circuit 120 shown in FIG. 3.

According to the design requirements, the control circuit 120 may include the logic circuit 121 and the processing circuit 122, and the logic circuit 121 may be coupled to the power supply circuit 110 to receive the state signals PG1 to PGn. In some embodiments, the logic circuit 121 may include a NOT-AND gate L1. The NOT-AND gate L1 may include one or more input ends coupled to the point-of-load circuits 112_1 to 112_n in the power supply circuit 110, and configured to receive the state signals PG1 to PGn and generate a determining signal LS according to the state signals PG1 to PGn. The determining signal LS is configured to determine whether the single event latch-up occurs in the power supply circuit 110. For example, in some embodiments, assuming that when the second voltages V2_1 to V2_n output by the point-of-load circuits 112_1 to 112_n all supply the power normally, the state signals PG1 to PGn all at the logic high levels may be generated correspondingly, and the NOT-AND gate L1 may output the determining signal LS at the logic low level. Furthermore, assuming that when at least one of the second voltages V2_1 to V2_n output by the point-of-load circuits 112_1 to 112_n supplies power abnormally, at least one of the state signals PG1 to PGn at the logic low level (the rest are still at the logic high levels) may be generated correspondingly, and the NOT-AND gate L1 may output the determining signal LS at the logic high level.

In this way, the control circuit 120 may determine whether the single event latch-up occurs in the power supply circuit 110 only through the logic circuit 121 according to the determining signal LS generated by the state signals PG1 to PGn. The state signals PG1 to PGn may be common signals (for example, the power good signals) on a main power supply path. Therefore, the power supply 400 in this embodiment is not required to be provided with a voltage or current acquisition circuit or a voltage comparison circuit additionally. As a result, the circuit complexity and the construction cost may be reduced, and the reliability may be improved. In addition, the logic circuit 121 monitors whether voltage states of all currents supplied to the load 130 is normal in real time, and then the processing circuit 122 switches an on/off state of the power supply circuit 110 according to the determining signal LS, so as to form a feedback control path of the power supply circuit 110. In some embodiments, according to the design requirements, the logic circuit 121 may further include an AND gate L2. The AND gate L2 may include two input ends respectively coupled to an output end of the NOT-AND gate L1 and the processing circuit 122 to respectively receive the determining signal LS and the driving signal generated by the processing circuit 122 (which is a delay signal D3 in this embodiment), and then may generate the reset signal RS according to the determining signal LS and the delay signal D3 at the same time.

According to the design requirements, the processing circuit 122 may include the controller 123 and the delay circuit 124. For example, in this embodiment, the controller 123 may include a switching circuit DFF, and the delay circuit 124 may include a delay circuit 124_1, a delay circuit 124_2, and a delay circuit 124_3. Input ends of the delay circuits 124_1 to 124_3 may collectively receive the fourth voltage V4 to sequentially generate a delay signal D1, a delay signal D2, and the delay signal D3. The delay signals D1 and D2 may be combined to be the first driving signal DS1 shown in FIG. 3, and the delay signal D3 may be used as the second driving signal DS2 shown in FIG. 3. Output ends of the delay circuits 124_1 to 1243 may be respectively coupled to an input end D of the switching circuit DFF, an input end CK of the switching circuit DFF, and the input end of the AND gate L2 in the logic circuit 121.

In some embodiments, according to the actual applications, the control circuit 120 may further include a voltage converter 125 coupled to the processing circuit 122. The voltage converter 125 may be configured to receive a first voltage V1' and generate the fourth voltage V4 according to the first voltage V1'. The first voltage V1' may be the same as or different from the first voltage V1, and this embodiment is not limited thereto. For example, in some embodiments, the first voltage V1' may be 28 volts, and the fourth voltage V4 may be 5 volts. In some embodiments, according to the design requirements, the control circuit 120 may further include a filter circuit 126 coupled to the processing circuit 122. The filter circuit 126 may be configured to filter the control signal CS generated by the processing circuit 122. For example, in some embodiments, the filter circuit 126 may include a debouncer circuit or other types of filter circuits, and this embodiment is not limited thereto.

In some embodiments, according to the actual applications, the control circuit 120 may further include a switch circuit 127 coupled between the processing circuit 122 and the power supply circuit 110. The switch circuit 127 may be configured to switch on and switch off the power supply circuit 110 according to the control signal CS and a reference voltage VSS. For example, in some embodiments, the switch circuit 127 may include a transistor M. A first end of the transistor M may be coupled to the power supply circuit 110. A second end of the transistor M may receive the reference voltage VSS. A control end of the transistor M may receive the control signal CS. In this embodiment, the transistor M may be an N-type bipolar transistor. In other embodiments, the transistor M may also be a P-type bipolar transistor, and this embodiment is not limited thereto. In some embodiments, the reference voltage VSS may be a DC low level, a ground level, or other voltage levels different from the first voltage V1, and this embodiment is not limited thereto.

In this embodiment, the control circuit 120 may respectively switch on or switch off the power supply circuit 110 by generating the control signal CS at different logic levels. For example, when the control circuit 120 determines that the single event latch-up occurs in the power supply circuit 110, the control circuit 120 may generate the control signal CS at the first logic level (for example, the logic high level) to switch off the voltage converter 111 in the power supply circuit 110, so that the voltage converter 111 stops generating the third voltage V3, and then switches off the point-of-load circuits 112_1 to 112_n at the same time to stop generating the second voltages V2_1 to V2_n and the state signals PG1 to PGn. In contrast, when the control circuit 120 determines that the single event latch-up does not occur in the power supply circuit 110, the control circuit 120 may generate the control signal CS at the second logic level (for example, the logic low level), so that the power supply circuit 110 may supply the power to the load 130 normally.

In some embodiments, the first voltage V1, the first voltage V1', and/or the fourth voltage V4 may be periodic voltages. For example, in aerospace missions, a low earth orbit satellite may provide power to a payload end only for a short period of time when orbiting the earth to communicate with a ground station, for example, 10% of the orbiting period. When the single event latch-up occurs in the power supply circuit 110, and the power supply circuit 110 is switched off by the control circuit 120, the control circuit 120 may continuously determine whether the fourth voltage V4 is changed through the processing circuit 122, for example, switched from the first voltage level (for example, the logic low level) to the second voltage level (for example, the logic high level), and generate the control signal CS according to the fourth voltage V4 to switch on the power supply circuit 110. In this way, the control circuit 120 may immediately switch off a main power path of the load 130 when the single event latch-up occurs in the power supply circuit 110. That is, all power supplies (the first voltage V1, the second voltages V2_1 to V2_n, and the third voltage V3) are reset to an original state, thereby eliminating a single event latch-up effect, and after estimated rated time, the power supply circuit 110 is restarted according to the re-powered fourth voltage V4. That is, a normal power supply to the load 130 is restored. For example, in the aerospace missions, since a satellite body is powered periodically, when the single event latch-up occurs, the power supply 400 may abandon the current periodic power supply of the satellite, and restart until the satellite body is powered next time, thereby avoiding the single event latch-up from affecting the circuit. Therefore, the power supply 400 in this embodiment is not required to be provided with a switch timing turn-on circuit additionally, thereby having effects of low circuit complexity and low cost. An operational waveform diagram of actual signals of the power supply circuit 110 and the control circuit 120 will be described in detail in the following embodiments.

Figure 5:
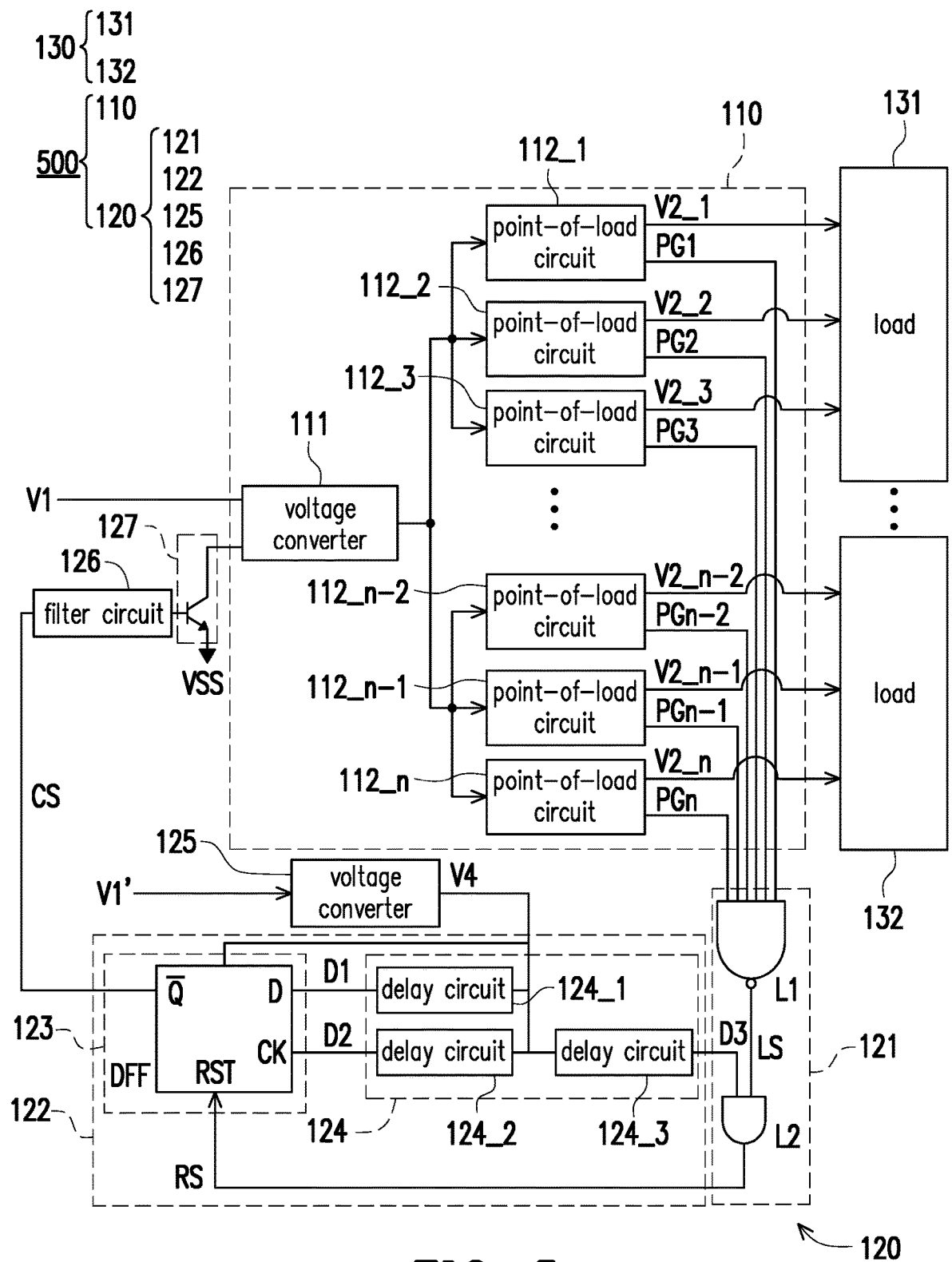
FIG. 5 is a schematic view of a circuit block of a power supply according to still another embodiment of the disclosure.

For another example, FIG. 5 is a schematic view of a circuit block of a power supply 500 according to still another embodiment of the disclosure. In the embodiment shown in FIG. 5, the power supply 500 includes the power supply circuit 110 and the control circuit 120. The power supply circuit 110 and the control circuit 120 shown in FIG. 5 may be derived by analogy with reference to related descriptions of the power supply circuit 110 and the control circuit 120 shown in FIG. 4. Thus, details in this regard will not be further reiterated in the following. The power supply 500 shown in FIG. 5 may be used as an implementation example of the power supply 100 shown in FIG. 1. A difference from FIG. 4 is that the load 130 shown in FIG. 5 may include multiple different loads, such as a load 131 and a load 132 in the figure, or other load devices which are not shown in FIG. 5.

In this embodiment, the second voltage V2_1, the second voltage V2_2, and the second voltage V2_3 generated by the point-of-load circuit 112_1, the point-of-load circuit 112_2, and the point-of-load circuit 112_3 in the power supply circuit 110 shown in FIG. 5 may be configure to supply the power to the load 131, and a second voltage V2_n-2, a second voltage V2_n-1, and the second voltage V2_n generated by a point-of-load circuit 112_n-2, a point-of-load circuit 112_n-1, and the point-of-load circuit circuit 112_n may be configure to supply the power to the load 132, and the rest may be derived by analog. The second voltages V2_1, V2_2, V2_3, V2_n-2, V2_n-1, and V2_n may have the same or different voltage values among one another, and this embodiment is not limited thereto. In this way, the power supply 500 in this embodiment supports scalability, thereby protecting multiple sets of load devices (such as the load 131 and the load 132) from the single event latch-up at the same time, and having the effect of low complexity.

Figure 6:
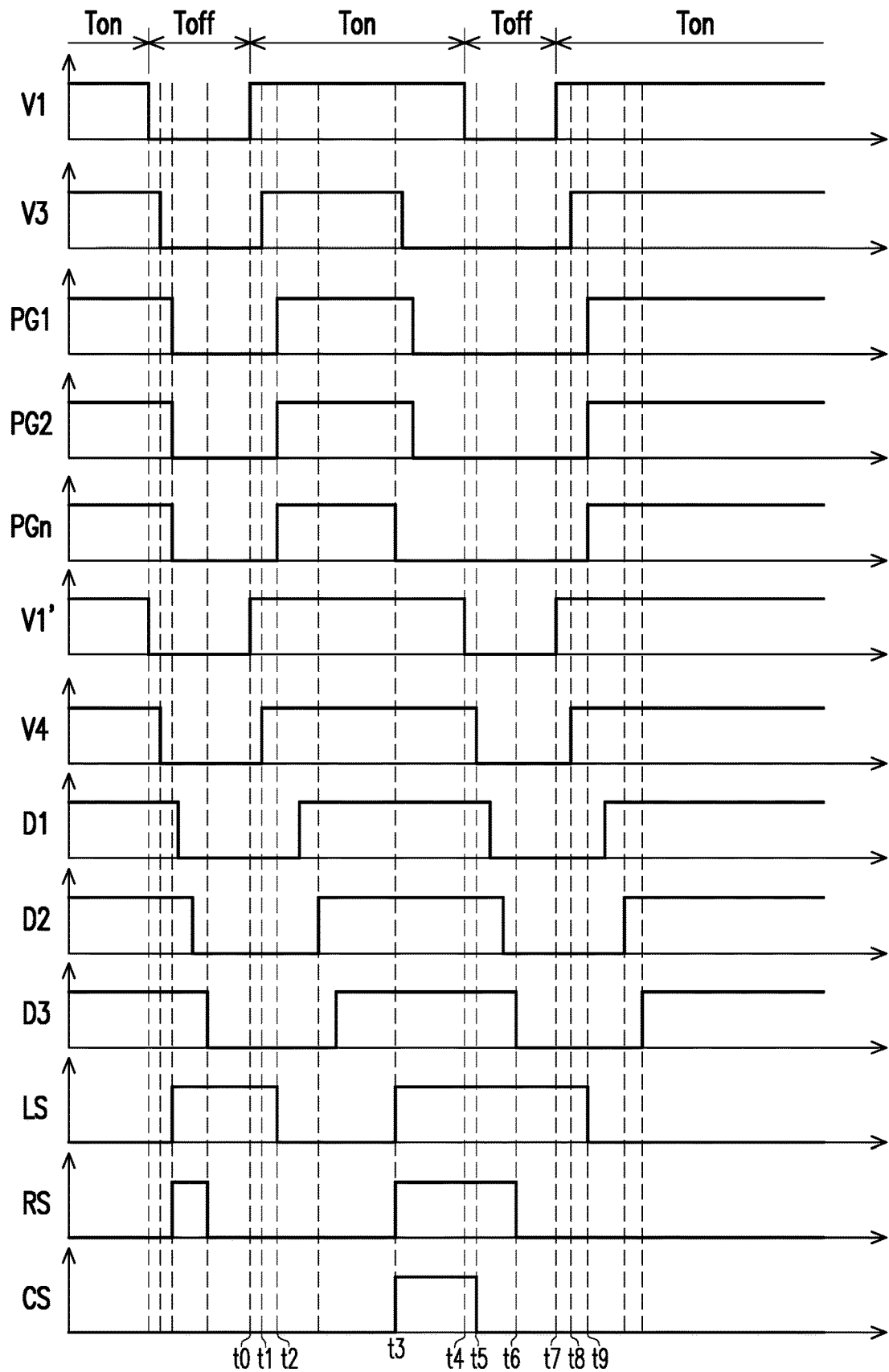
FIG. 6 is a schematic view of operational waveforms of the power supply shown in FIG. 4 according to an embodiment of the disclosure.

FIG. 6 is a schematic view of operational waveforms of the power supply shown in FIG. 4 according to an embodiment of the disclosure. Referring to both FIGS. 4 and 6, a horizontal axis shown in FIG. 6 denotes time, and a vertical axis denotes a logic level of each of voltages and signals. In the embodiment shown in FIG. 6, it is assumed that the first voltage V1 and the first voltage V1' are the same voltage source, and both have a power supply period Ton and a non-power supply period Toff. In detail, at time t0, both the first voltage V1 and the first voltage V1' are switched from the logic low level to the logic high level, that is, entering the power supply period Ton. At time t1, the voltage converter 111 in the power supply circuit 110 may generate the third voltage V3 according to the first voltage V1, and the voltage converter 125 in the control circuit 120 may generate the fourth voltage V4 according to the first voltage V1'. That is, both the third voltage V3 and the fourth voltage V4 are switched from the logic low level to the logic high level. At time t2, the point-of-load circuits 112_1 to 112_n in the power supply circuit 110 may respectively generate the second voltages V2_1 to V2_n and the state signals PG1 to PGn according to the third voltage V3.

Assuming that the second voltages V2_1 to V2_n are all supply the power normally at this time, that is, the state signals PG1 to PGn are all switched from the logic low level to the logic high level, the NOT-AND gate L1 of the logic circuit 121 in the control circuit 120 may generate the determining signal LS according to the state signals PG1 to PGn, that is, the determining signal LS is switched from the logic high level to the logic low level. After the time t2, the delay circuits 124_1 to 124_3 of the processing circuit 122 in the control circuit 120 may respectively generate the delay signals D1 to D3 in sequence according to the fourth voltage V4. That is, the delay signals D1 to D3 are switched from the logic low levels to the logic high level in sequence. At this time, the determining signal LS is at the logic low level, and the delay signal D3 is at the logic high level. Therefore, the AND gate L2 in the logic circuit 121 generates the reset signal RS at the logic low level according to the determining signal LS and the delay signal D3. In terms of the switching circuit DFF of the controller 123 in the control circuit 120, since the delay signals D1 and D2 are both at the logic high level; the reset signal RS is at the logic low level, and the switching circuit DFF receives the power supplied by the fourth voltage V4, the switching circuit DFF may generate the control signal CS at the logic low level. Therefore, at this time, the control circuit 120 does not affect the power supply of the power supply circuit 110 to the load 130.

Now assuming that at time t3, the single event latch-up occurs in the point-of-load circuit 112_n, that is, the state signal PGn is switched from the logic high level to the logic low level (the rest of the state signals PG1 and PG2 are not affected and remain at the logic high level), then the determining signal LS generated by the NOT-AND gate L1 is switched from the logic low level to the logic high level. At this time, since the determining signal LS and the delay signal D3 are both at the logic high level, the reset signal RS generated by the AND gate L2 is switched from the logic low level to the logic low level. In terms of the switching circuit DFF, since the delay signals D1 and D2, and the reset signal RS are all at the logic high level, the control signal CS generated by the switching circuit DFF is switched from the logic low level to the logic high level. At this time, the control circuit 120 switches off the voltage converter 111 through the switch circuit 127, thereby stopping generating the third voltage V3. Therefore, after the time t3, the third voltage V3 is switched from the logic high level to the logic low level, and the point-of-load circuits 112_1 to 112_n also stop generating the second voltages V2_1 to V2_n and the state signals PG1 to PGn, thereby switching off all the power supplies to the load 130 to solve the single event latch-up effect. That is, the state signals PG1 to PG2 are switched from the logic high level to the logic low level at the same time, and at this time, the first voltages V1 and V1', and the fourth voltage V4 still supply the power normally.

At time t4, the first voltage V1 and the first voltage V1' enter the non-power supply period Toff. That is, both the first voltages V1 and V1' is switched from the logic high level to the logic low level. Then, at time t5, the fourth voltage V4 generated by the voltage converter 125 is switched from the logic high level to the logic low level. At this time, the switching circuit DFF stops generating the control signal CS due to no voltage supply. That is, the control signal CS is switched from the logic high level to the logic low level. In addition, after the time t5, since the voltage converter 125 stops generating the fourth voltage V4, the delay signals D1 to D3 are also sequentially switched from the logic high level to the logic low level. At time t6, since the determining signal LS is at the logic high level, and the delay signal D3 is at the logic low level, the reset signal RS generated by the AND gate L2 is switched from the logic high level to the logic low level. After the time t6, only the determining signal LS still remains at the logic high level, and the rest of the voltages and the signals are at the logic low level.

Next, at time t7, the first voltage V1 and the first voltage V1' reenter the power supply period Ton, that is, switched from the logic low level to the logic high level again. At time t8, the third voltage V3 and the fourth voltage V4 are also switched from the logic low level to the logic high level again. At time t9, the point-of-load circuits 112_1 to 112n regenerate the second voltages V2_1 to V2_n and the state signals PG1 to PGn. Assuming that the single event latch-up effect has been solved at this time, that is, the state signals PG1 to PGn are all switched from the logic low level to the logic high level, the determining signal LS generated by the NOT-AND gate L1 is switched from the logic high level to the logic low level. At this time, the power supply circuit 110 may resume supplying power normally. In this way, the power supply 400 in this embodiment may not only immediately cut off all the power supplies to the load 130 when the single event latch-up occurs to restore all the power supplies to the original state to solve the single event latch-up, but also restart to supply the power to the load 130 after the single event latch-up effect is solved.

Based on the above, the power supplies 100, 400, and 500 in the embodiments of the disclosure may supply the power to the load 130 through the power supply circuit 110, determines whether the single event latch-up occurs in the power supply circuit 110 through the control circuit 120, and switches off the power supply circuit 110 through the control circuit 120 to cut off all the power supplies to the load 130 from all the point-of-load circuits 112_1 to 112_n in the power supply circuit 110 when the single event latch-up occurs. In this way, the least logic control circuit may be used to detect and deal with the single event latch-up effect, thereby avoiding the burning of the circuit elements caused by excessive current, so as to protect the load devices that are sensitive to the single event latch-up, and the power supply is restored after the single event latch-up is solved, which has the effects such as low circuit complexity, low design cost, and high circuit reliability.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A power supply, comprising:
   a power supply circuit generating at least one second voltage and at least one state signal according to a first voltage, wherein the at least one second voltage is suitable for supplying power to a load; and
   a control circuit coupled to the power supply circuit, wherein the control circuit determines whether a single event latch-up occurs in the power supply circuit according to the at least one state signal, and when the single event latch-up occurs in the power supply circuit, the control circuit switches off the power supply circuit to stop generating the at least one second voltage and the at least one state signal, wherein the power supply circuit comprises:
a voltage converter generating a third voltage according to the first voltage; and
a plurality of point-of-load circuits coupled to the voltage converter, wherein the plurality of point-of-load circuits generate the at least one second voltage and the at least one state signal according to the third voltages,
wherein the control circuit receives a fourth voltage, the fourth voltage is a periodic voltage, and when the single event latch-up occurs in the power supply circuit, and the fourth voltage is switched from a first voltage level to a second voltage level, the control circuit switches on the power supply circuit.

2. The power supply according to claim 1, wherein when the single event latch-up occurs in the power supply circuit, the control circuit switches off the voltage converter to stop generating the third voltage.

3. The power supply according to claim 1, wherein the control circuit comprises:
a logic circuit coupled to the power supply circuit, wherein the logic circuit generates a reset signal according to the at least one state signal; and
a processing circuit coupled to the logic circuit, wherein the processing circuit generates a control signal according to the reset signal and/or a fourth voltage, and the control signal is configured to switch on and switch off the power supply circuit.

4. The power supply according to claim 3, wherein the processing circuit comprises:
a delay circuit coupled to the logic circuit, wherein the delay circuit generates a first driving signal and a second driving signal according to the fourth voltage, and the logic circuit generates the reset signal according to the at least one state signal and the second driving signal; and a controller coupled to the delay circuit, the logic circuit, and the power supply circuit, wherein the controller generates the control signal according to the first driving signal and the reset signal.

5. The power supply according to claim 4, wherein the logic circuit comprises:
a NOT-AND gate coupled to the power supply circuit, wherein the NOT-AND gate generates a determining signal according to the at least one state signal, and the determining signal is configured to determine whether the single event latch-up occurs in the power supply circuit; and
an AND gate coupled to the NOT-AND gate and the processing circuit, wherein the AND gate generates the reset signal according to the determining signal and the second driving signal.

6. The power supply according to claim 3, wherein the control circuit further comprises:
a voltage converter coupled to the processing circuit, wherein the voltage converter is configured to generate the fourth voltage according to the first voltage.

7. The power supply according to claim 3, wherein the control circuit further comprises:
a filter circuit coupled to the processing circuit, wherein the filter circuit is configured to filter the control signal.

8. The power supply according to claim 3, wherein the control circuit further comprises:
a switch circuit coupled between the processing circuit and the power supply circuit, wherein the switch circuit is configured to switch on and switch off the power supply circuit according to the control signal and a reference voltage.

* * * * *